(12) United States Patent
Carty et al.

(10) Patent No.: US 10,530,151 B2
(45) Date of Patent: Jan. 7, 2020

(54) SYSTEM AND METHOD FOR SUPPRESSING ELECTROMAGNETIC PULSE-INDUCED ELECTRICAL SYSTEM SURGES

(71) Applicants: Timothy A Carty, Waverly, KS (US); Harold Stanley Deyo, Jr., Pueblo West, CO (US)

(72) Inventors: Timothy A Carty, Waverly, KS (US); Harold Stanley Deyo, Jr., Pueblo West, CO (US)

(*) Notice: Subject to any disclaimer, the term of this patent is extended or adjusted under 35 U.S.C. 154(b) by 0 days.

(21) Appl. No.: 16/240,897

(22) Filed: Jan. 7, 2019

(65) Prior Publication Data
US 2019/0214814 A1 Jul. 11, 2019

Related U.S. Application Data

(60) Provisional application No. 62/615,159, filed on Jan. 9, 2018.

(51) Int. Cl.
*H02H 9/04* (2006.01)
*H02H 5/00* (2006.01)

(52) U.S. Cl.
CPC ............ *H02H 9/045* (2013.01); *H02H 5/005* (2013.01)

(58) Field of Classification Search
CPC ........ H02H 1/0007; H02H 1/04; H02H 3/023; H02H 3/08; H02H 3/105; H02H 3/16; H02H 3/162; H02H 3/20; H02H 3/50; H02H 3/52; H02H 5/005; H02H 7/26; H02H 9/005; H02H 9/04; H02H 9/045; H02H 3/22; H02H 7/09; H02H 7/1252; H02H 9/00; H02H 9/046; G05F 1/571; H01C 7/10

See application file for complete search history.

(56) References Cited

U.S. PATENT DOCUMENTS

| | | | | |
|---|---|---|---|---|
| 4,553,189 A | * | 11/1985 | Pivit | H02H 9/06 361/119 |
| 4,669,027 A | * | 5/1987 | Elsner | H02H 9/06 361/111 |
| 6,392,318 B1 | * | 5/2002 | Griffis | H01H 47/002 307/125 |
| 9,450,410 B2 | * | 9/2016 | Moore | H02J 3/18 |
| 2015/0004847 A1 | * | 1/2015 | Namkoong | H01R 24/42 439/638 |
| 2016/0126738 A1 | * | 5/2016 | Moore | H02J 3/18 361/35 |
| 2016/0197469 A1 | * | 7/2016 | Fuchs | H02H 7/04 361/35 |
| 2018/0136267 A1 | * | 5/2018 | Yao | G01R 31/001 |
| 2019/0036326 A1 | * | 1/2019 | Anderson | H02H 7/04 |

* cited by examiner

*Primary Examiner* — Thienvu V Tran
*Assistant Examiner* — Nicolas Bellido
(74) *Attorney, Agent, or Firm* — Dale J. Ream

(57) ABSTRACT

A system and method for suppressing EMP-induced electrical system voltage surges due to detonation of a nuclear weapon, the EMP comprising E1, E2, and E3 component pulses. A plurality of shunting assemblies, each including MOVs, gas discharge tubes, other mechanical, electrical and ionization discharge devices and combinations thereof, detect and react to the overvoltage according to timing parameters associated with each of the E1, E2, and E3 components and shunt the overvoltage to decrease to under a predetermined allowable level.

22 Claims, 6 Drawing Sheets

SYSTEM AND METHOD FOR SUPPRESSING ELECTROMAGNETIC PULSE-INDUCED ELECTRICAL SYSTEM SURGES

REFERENCE TO RELATED APPLICATIONS

This application claims the priority of provisional patent application U.S. Ser. No. 62/615,159 filed Jan. 9, 2018 titled System and Method For Suppressing Electromagnetic Pulse-Induced Electrical System Surges and which is incorporated in its entirety herein by reference.

BACKGROUND OF THE INVENTION

An electromagnetic pulse, or EMP, can be generally characterized as a short term burst of electromagnetic radiation generated by either natural or man-made activities. Most commonly, however, the term "EMP" is used to specifically describe the electromagnetic burst generated in association with the detonation of a nuclear weapon. Thus, the term "EMP" as used herein refers to the electromagnetic pulse generated by a weapon such as a nuclear weapon or a non-nuclear EMP weapon.

The EMP from such a weapon is capable of inducing voltages and corresponding currents into electrical systems such as wide-area power distribution grids, as well as into the electrical systems of homes, commercial buildings, and even vehicle electrical systems. Unless prevented or suppressed, that unwanted induced current can damage or destroy components within the affected electrical systems, diminishing the operability of the electrical system or oftentimes rendering it unusable until repaired. Again, it is understood that a massive solar event may create a similar electrical catastrophe. For instance, a coronal mass ejection is a sun eruption of super-hot plasma that spews charged particles across the solar system and may induce overcurrents in the electrical grid, overheating of transformers, and cause mass failure within the electrical grid.

While surge suppressors for electrical systems are known in the art, those suppressors are typically optimized for use only with surges of relatively short duration caused by commonly occurring phenomena, such as lightning strikes or electrical system failures (e.g., the failure of a transformer in the power distribution grid or a short introduced across electrical lines). Those known surge suppressors, however, are generally ineffective against the complex, multiple surges caused or generated by a weapon-induced EMP pulse.

Unlike the electromagnetic radiation or pulse associated with common phenomena, the EMP generated by a nuclear weapon comprises multiple pulses of varying duration, such that the EMP is more accurately considered as a complex, electromagnetic multi-pulse, usually described in terms of three primary components defined by the International Electrotechnical Commission (IEC) as E1, E2, and E3.

Thus, because of the complex nature of an EMP pulse, comprised of E1, E2, and E3 components, it can be seen that there remains a need in the art for an improved system and method for suppressing electrical surges generated by an EMP promulgated from a detonated nuclear weapon. Therefore, it would be desirable to have a system and method for suppressing electromagnetic pulse-induced electrical system surges induced by the E1, E2, and E3 components of an electromagnetic radiation complex multi-pulse generated by the detonation of a nuclear weapon.

SUMMARY OF THE INVENTION

Embodiments of the invention are defined by the claims below, not this summary. A high-level overview of various aspects of the invention are provided here for that reason, to provide an overview of the disclosure, and to introduce a selection of concepts that are further described in the Detailed Description section below. This summary is not intended to identify key features or essential features of the claimed subject matter, nor is it intended to be used as an aid in isolation to determine the scope of the claimed subject matter. In brief, this disclosure describes, among other things, a system and method for suppressing electrical surges induced by the E1, E2, and E3 components of an electromagnetic radiation complex multi-pulse generated by the detonation of a nuclear weapon.

In one aspect, the system and method for suppressing electromagnetic pulse-induced electrical system surges comprises a plurality of shunts placed between, and in electrical communication with, a plurality of power lines in an electrical system, such that a voltage differential between electrical power lines that exceeds a predetermined level is shunted by at least one of the plurality of shunts to prevent the voltage differential from exceeding a desired level.

In another aspect, the response time of the plurality of shunts and the allowable differential voltage level of the shunts are selected and combined to achieve a desired response time and protection level to react to the E1, E2, and E3 components of a complex multi-pulse EMP pulse generated by detonation of a nuclear weapon.

In a further aspect, the system and method protect line-to-line, line-to-neutral, neutral to ground, and line-to-ground arrangements of an electrical system's power lines, as well as combinations and sub-combinations thereof.

In alternative embodiments, the system and method of the present invention are configured to protect single-phase and three-phase land-based electrical systems, in further alternative embodiments the system and method are configured for use on the electrical systems of vehicles, such as automobiles, trucks, locomotives, boats, aircraft and other vehicles employing on-board electrical systems.

BRIEF DESCRIPTION OF THE DRAWINGS

Illustrative embodiments of the invention are described in detail below with reference to the attached drawing figures, and wherein.

DESCRIPTION OF THE PREFERRED EMBODIMENT

Figure 1:
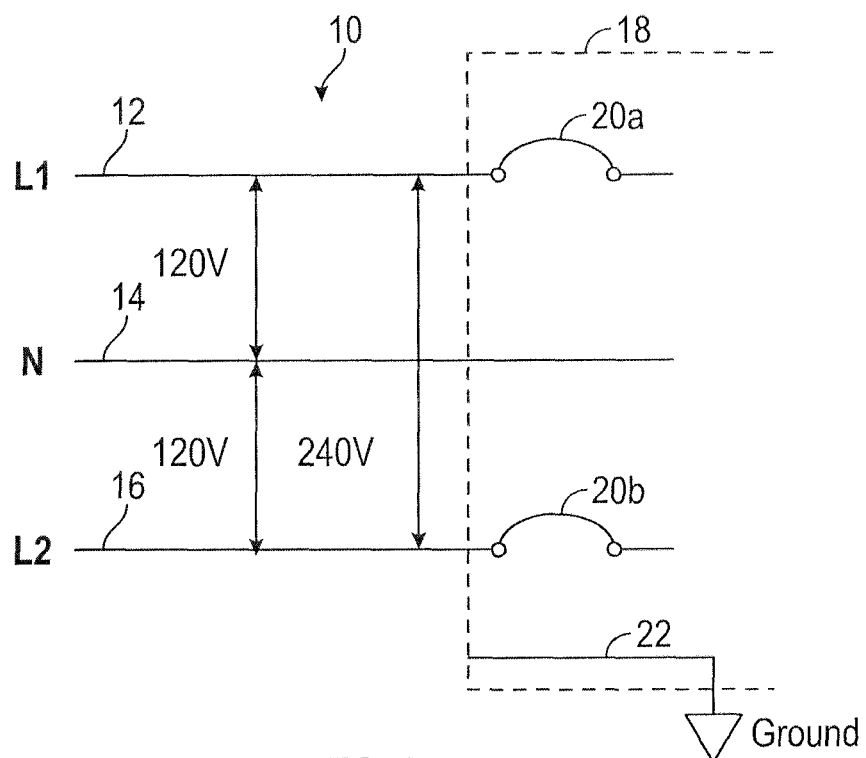
FIG. 1 is a schematic depiction of an exemplary prior art single-phase electrical system.

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described. The terms "about", "approximately", or other terms of approximation as used herein denote deviations from the exact value in the form of changes or deviations that are insignificant to the function.

As initially presented above, an EMP generated by detonation of a nuclear weapon comprises multiple pulses of varying duration, such that the EMP is more accurately considered as a complex, electromagnetic multi-pulse, usually described in terms of three primary components defined by the International Electrotechnical Commission (IEC) as E1, E2, and E3. The nature of these pulses is described below.

The E1 component of the complex multi-pulse is produced when gamma radiation from the nuclear detonation knocks electrons out of the atoms in the upper atmosphere. The electrons begin to travel in a generally downward direction at relativistic speeds (i.e., at more than 90 percent of the speed of light). In the absence of a magnetic field, the displaced electrons would produce a large pulse of electric current vertically in the upper atmosphere over the entire affected area. However, the Earth's magnetic field acts on the electrons to change the direction of electron flow so that it is at a right angle to the geomagnetic field. This interaction of the Earth's magnetic field and the downward electron flow produces a very large, but very brief, electromagnetic pulse over the affected area.

The process of gamma rays knocking electrons from the atoms in the mid-stratosphere ionizes that region, causing it to become an electrical conductor, that ionization blocking the production of further electromagnetic signals and causing the field strength to saturate at about 50,000 volts per meter. The strength of the E1 pulse depends upon the number and intensity of the gamma rays produced by the weapon. The strength of the E1 pulse is, to a lesser extent, also dependent upon the altitude of the detonation of the nuclear device.

The interaction of the very rapidly moving negatively charged electrons with the magnetic field radiates a short duration, intense pulse of electromagnetic energy. The pulse typically rises to its peak magnitude in about five nanoseconds and decays to half of its peak value within two-hundred nanoseconds. By IEC definition, an E1 pulse ends within one microsecond after it begins.

Thus, the E1 component is a short-duration, intense electromagnetic pulse capable of inducing very high voltages in electrical conductors. That induced high voltage typically exceeds the breakdown voltage of common electrical system components such as those used in computers and communications equipment, degrading and/or destroying those components. Because the E1 component pulse occurs so quickly, most commonly available lightning surge protectors are unable to act to suppress the surge induced into an electrical system by an E1 pulse. The E2 component of the complex multi-pulse is generated by scattered gamma rays and inelastic gammas produced by neutrons emitted by the weapon. The E2 component is a pulse of intermediate time duration, that, by IEC definition, lasts from about one microsecond to one second after the beginning of the electromagnetic pulse. The E2 component of the pulse has many similarities to an electromagnetic pulse produced by lightning, although the electromagnetic pulse induced by a very close lightning strike may be considerably larger than the E2 component of a nuclear EMP.

Because of the similarities to lightning-caused pulses and the widespread availability of lightning protection technology, the E2 pulse is generally considered to be the easiest to protect against. However, because an EMP produced by a nuclear weapon comprises a complex multi-pulse (i.e., the E1, E2, and E3 components), the primary potential problem with the E2 component is the fact that it immediately follows an E1 component which likely damaged any devices that were intended to protect against a lightning strike type surge that could have potentially protected against the E2 component pulse. As noted in the United States EMP Commission's Executive Report of 2004, referring to the E2 component pulse, "[i]n general, it would not be an issue for critical infrastructure systems since they have existing protective measures for defense against occasional lightning strikes. The most significant risk is synergistic, because the E2 component follows a small fraction of a second after the first component's insult, which has the ability to impair or destroy many protective and control features. The energy associated with the second component thus may be allowed to pass into and damage systems."

The E3 component of the complex multi-pulse is a very slow pulse, lasting tens to hundreds of seconds, caused by the nuclear detonation heaving the Earth's magnetic field out of the way, followed by the restoration of the magnetic field to its natural place. The E3 component has similarities to a geomagnetic storm caused by a very severe solar corona mass ejection (CME), or stellar-induced EMP's from stellar gamma ray burst sources, super novae, hypernovae and collisions of neutron stars. Similar to a geomagnetic storm, an E3 pulse can produce geomagnetically induced currents in long electrical conductors, which can then damage or destroy components such as power line transformers. The E3 induced currents are often called quasi-DC currents because by their long duration they more resemble a direct current from a battery rather than a short duration pulse. Nearly all of the damage from E3 in modern systems occurs to the AC power grid, which is generally not designed to handle direct currents, especially in critical devices such as power transformers which are ubiquitous in AC power distribution systems.

Now, looking first to FIG. 1, a schematic representation of a typical prior art single-phase electrical system, such as an electrical system for a house or residence, is depicted generally by the numeral 10. The electrical system comprises three power lines 12, 14, 16, providing electrical power into the house from an external power distribution grid. Power into the house is typically taken from a nearby transformer, such as a pole-mount or surface mount location. The lines entering the house 12, 14, and 16 typically include two power lines (12, 16), each carrying alternating current electricity at a potential of approximately 120 volts (with respect to neutral), and a neutral line (14) having a potential of approximately 0 volts. Such a power system is typically referred to as a 120/240 volt system, with the two power lines 12, 16, typically referred to as L1 and L2 lines, respectively, each providing 120 volts with respect to the neutral line, and providing 240 volts with respect to each other. Thus, the power system to the house provides two "legs" of 120 volt power, or 240 volts taken between the L1 and L2 lines.

The power lines 12, 16 from the external transformer are commonly directed into a breaker box 18 located inside the house and to a main circuit breaker (or breakers) 20*a*, 20*b* which protect against downstream overcurrent and allow a homeowner or service person to shut off the entering power. From the main circuit breaker(s) 20*a*, 20*b*, the electricity is typically distributed to a further series of circuit breakers which define electrical circuits within the house to which the electricity is distributed for powering lights, appliances, and the like.

A ground wire 22 attached to an earth ground, such as a buried conductive stake or buried conductive water line, is similarly routed into the breaker box to provide a ground path accessible within the breaker box. The ground wire is typically not provided from the external distribution grid as are the L1, L2, and neutral lines 12, 14, 16. Depending on the local building codes and the desired house electrical system configuration, the ground wire is often tied to the neutral line at the breaker box so that the neutral wire is nominally at ground potential at that location.

Figure 2:
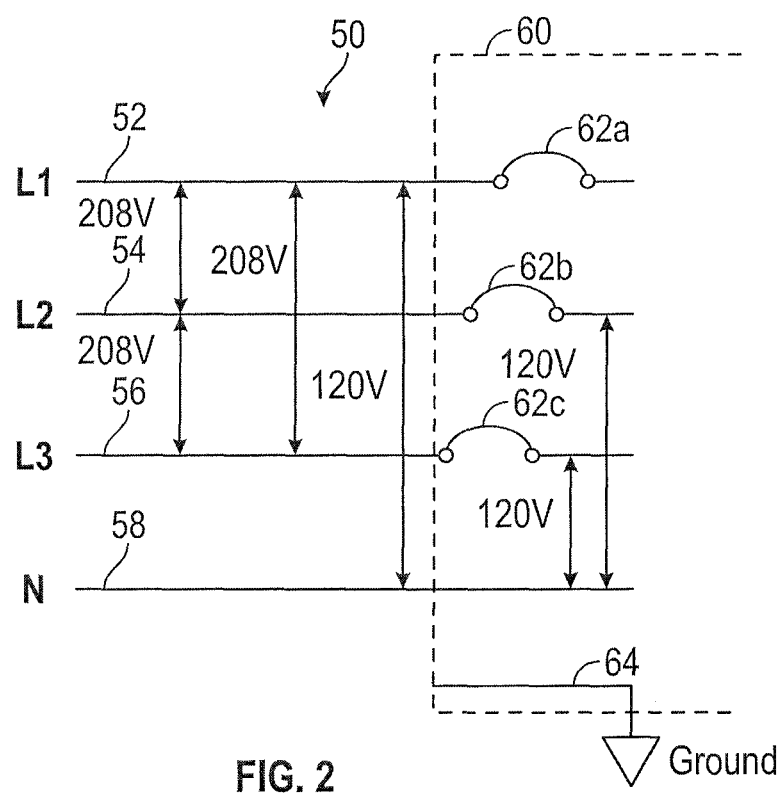
FIG. 2 is a schematic depiction of an exemplary prior art three-phase electrical system.

Looking to FIG. 2, a schematic representation of a typical prior art three-phase electrical system, such as an electrical system for a commercial building, is depicted generally by the numeral 50. The electrical system comprises four power lines 52, 54, 56, 58, providing electrical power into the building from an external power distribution grid. Power into the building is typically taken from a nearby transformer, such as a pole-mount or surface mount location. The lines entering the building 52, 54, 56, 58 typically include three power lines (52, 54, 56), each carrying alternating current electricity at a potential of approximately 120 volts (with respect to neutral), and a neutral line (58) having a potential of approximately 0 volts. Such a power system is typically referred to as a 208 volt 3 phase system, with the three power lines 52, 54, 56 typically referred to as P1, P2, and P3, lines, or Phase 1, Phase 2, and Phase 3 lines, and with the voltage between the various phases measuring 208 volts as the current on each of the phases is one-hundred and twenty degrees out of phase with the preceding and succeeding phase.

Similar to the single-phase system, the power lines 52, 54, 56, 58 from the external transformer in a three-phase system are commonly directed into a breaker box 60 located inside the building and into a main circuit breaker (or breakers) 62*a*, 62*b*, 62*c* which protect against downstream overcurrent of electricity and allow a service person to shut off the entering power. From the main circuit breaker(s) 62*a*, 62*b*, 62*c*, the electricity is typically distributed to a further series of circuit breakers which define electrical circuits within the building to which the electricity is distributed to power lights, equipment, and the like.

A ground wire 64 attached to an earth ground, such as a buried conductive stake or buried conductive water line, is similarly routed into the breaker box to provide a ground path within the breaker box. The ground wire is typically not provided from the external distribution grid as are the L1, L2, L3 and neutral lines 52, 54, 56, 58. Depending on the local building codes and the desired building electrical system configuration, the ground wire is often tied to the neutral line at the breaker box so that the neutral wire is nominally at ground potential at that location.

As just described, typical single-phase and three-phase land-based electrical systems in houses and commercial buildings receive power distributed through a power grid system comprising miles of interconnected wires and transformers distributing power across expansive geographical areas, with power transmission lines and wires typically strung between poles or buried relatively shallowly in the ground. The expansiveness of the power grid system makes it particularly susceptible to induced voltages and/or currents generated by a nuclear weapon detonated in proximity to any part of the power grid system, and facilitates the distribution of any such induced disturbances caused by the E1, E2, and E3 components of a nuclear EMP. Looking to FIG. 3 through 5, diagrams of the magnitude and timing of the three components, E1, E2, and E3 of the complex, multi-pulse EMP caused by a detonated nuclear weapon are depicted. It should be apparent to those skilled in the art that the timing diagrams present the elapsed time (x-axis) using a logarithmic scale. It should also be understood that the magnitude in the timing diagrams (y-axis) is not an absolute value, but represents the values of electromagnetic energy from a given reference or measurement point. For example, the peak magnitudes discussed with respect to the E1, E2, and E3 components below refer to the largest magnitude as measured from any given location with respect to the detonation point of the nuclear weapon, and that the peak value measured from a different location may be larger or smaller, depending on numerous factors including the distance from the detonation point. It should be further understood that regardless of the absolute peak value at any given measurement location that the shape and timing of the pulse will be essentially identical for any given measurement location. Furthermore, it should be understood that because the voltages induced into a power grid and/or electrical system by an EMP pulse are proportional to the magnitude of the electromagnetic energy introduced into the power grid, that the timing and shape of a timing diagram of the induced voltage will likewise be essentially identical to that of the electromagnetic energy diagram.

Figure 3:
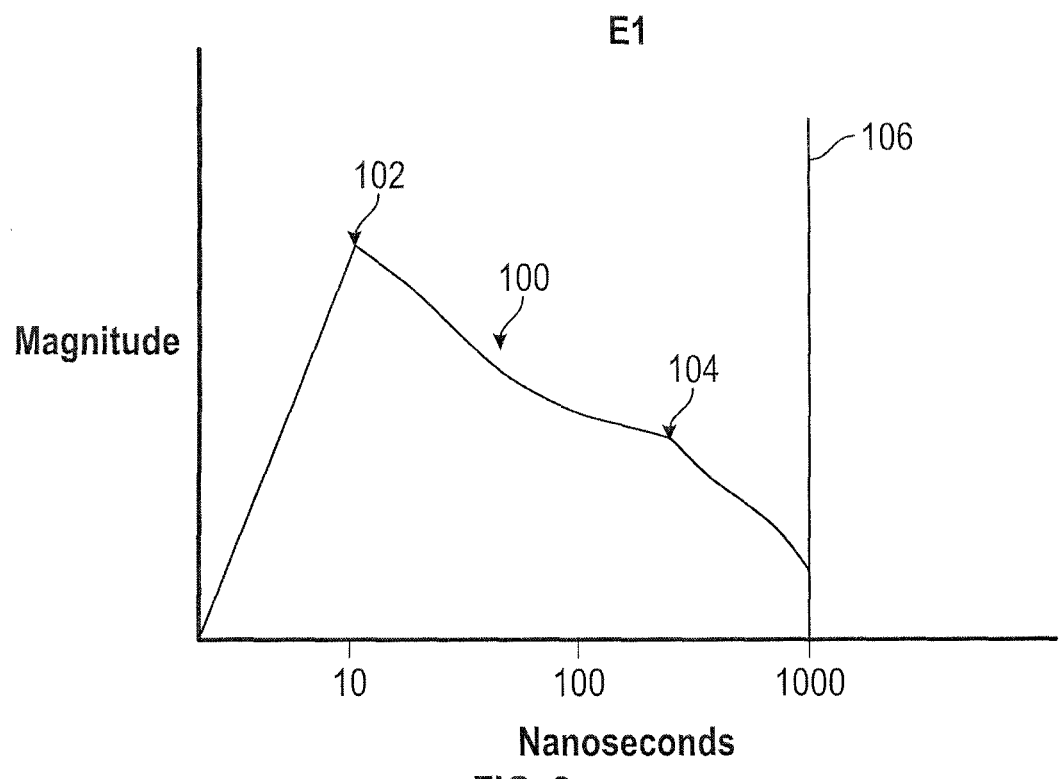
FIG. 3 is a graphical timing diagram representation of the E1 component of an exemplary EMP pulse.

Turning first to FIG. 3, and as discussed above, the E1 component pulse is a short duration, intense pulse of energy, depicted as numeral 100. As seen in the figure, the pulse rises to its peak magnitude 102 within about five nanoseconds, and decays to half of its peak value 104 within about two-hundred nanoseconds. As defined by the IEC, an E1 pulse ends 106 within one-thousand nanoseconds (i.e., one microsecond) from the time it begins.

Figure 4:
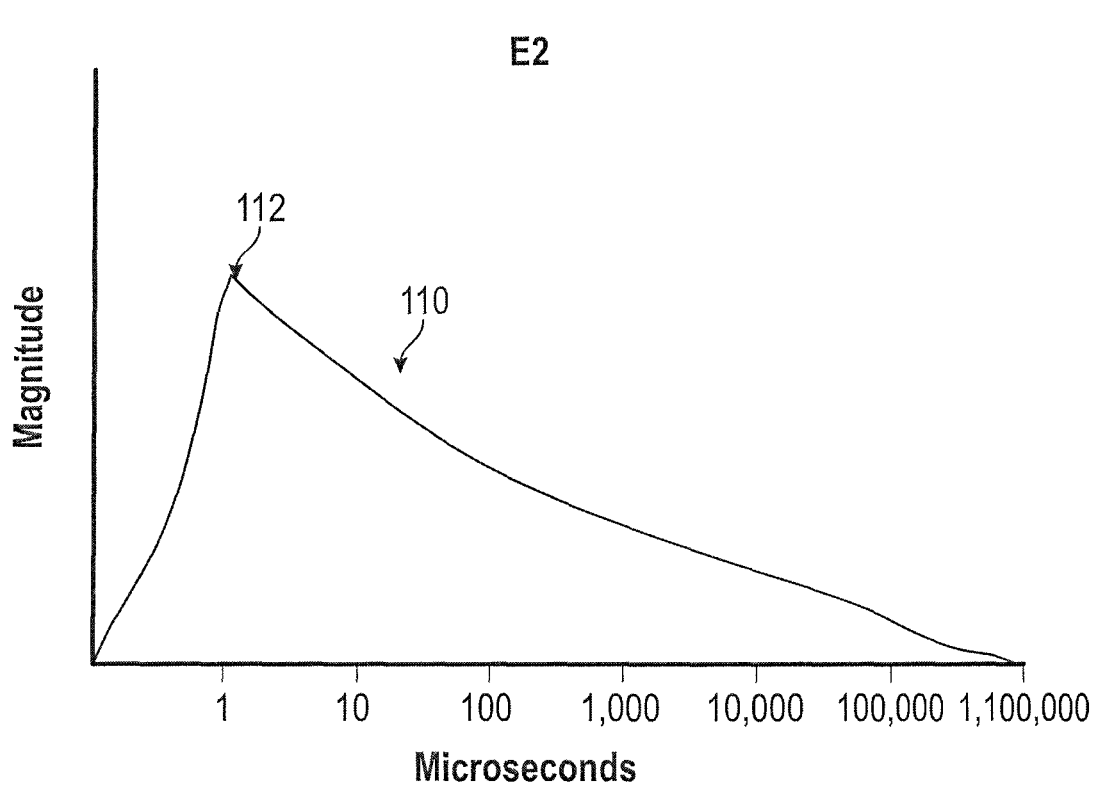
FIG. 4 is a graphical timing diagram representation of the E2 component of an exemplary EMP pulse.

Looking next to FIG. 4, and as discussed above, the E2 component is a pulse 110 of intermediate time duration, that reaches a peak 112 about one microsecond after the beginning of the electromagnetic pulse, with a duration typically less than one second. As also discussed above, the E2 component pulse 110 has many similarities to a pulse produced by a nearby lighting strike, with a relatively slow (as compared to the E1 component) rise time, and an intermediate duration (not more than about one second).

Figure 5:
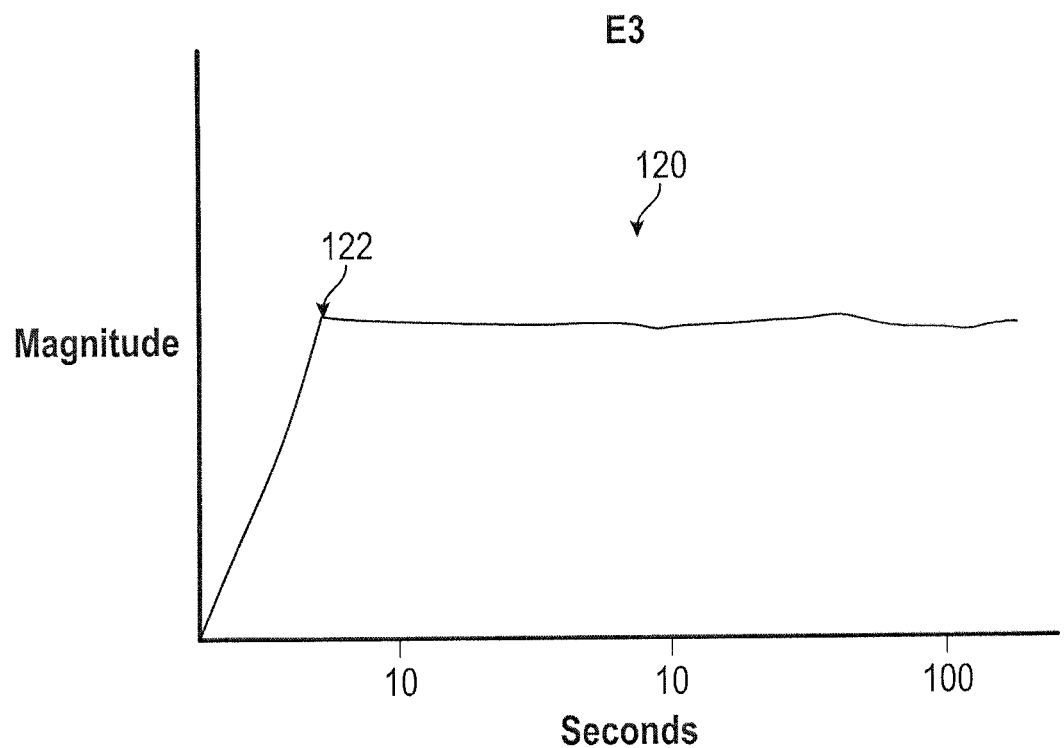
FIG. 5 is a graphical timing diagram representation of the E3 component of an exemplary EMP pulse.

Finally, turning to FIG. 5, the E3 component pulse 120 is a very slow pulse reaching a peak magnitude 122 and lasting tens to hundreds of seconds.

Thus, as is apparent in the E1, E2, and E3 component timing diagrams of FIGS. 3 through 5, the complex multi-pulse of an EMP generated by a detonated nuclear weapon presents multiple pulses having varying timing signatures which cannot all be suppressed using known surge suppression devices.

Figure 6:
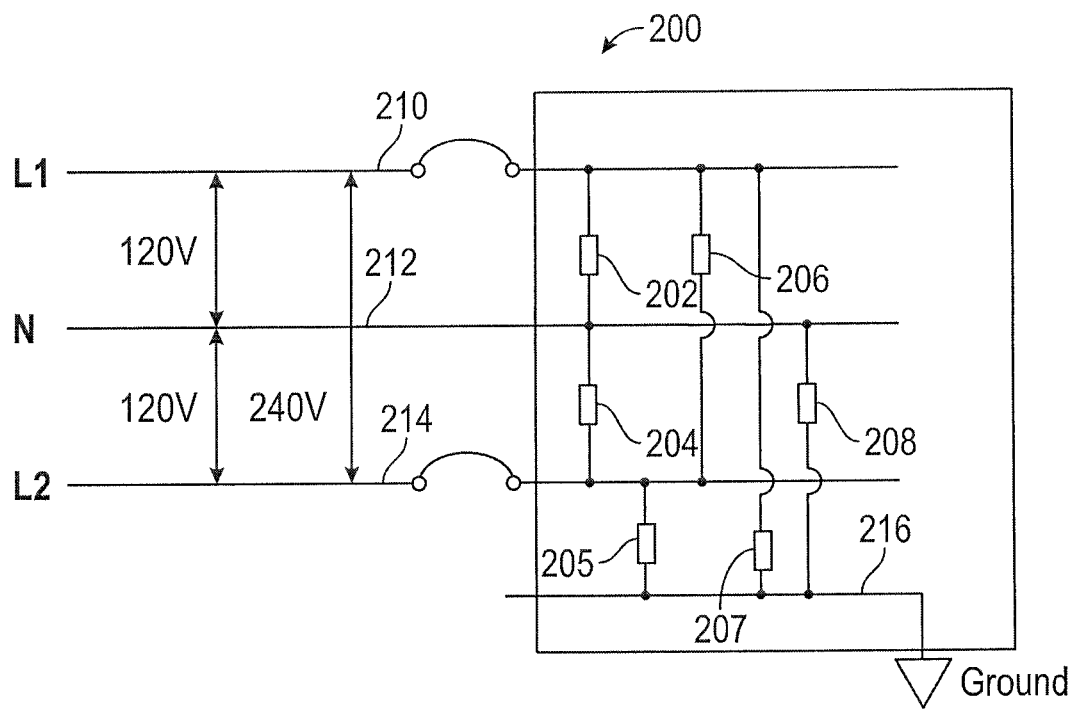
FIG. 6 is a schematic diagram of an exemplary embodiment of the system and method of the present invention for use with a typical single-phase electrical system.

Looking to FIG. 6, a system for suppressing an EMP generated by detonation of a nuclear weapon is depicted generally by the numeral 200, shown connected to a typical single-phase electrical system as described previously with respect to FIG. 1.

The system 200 comprises a plurality of shunt assemblies 202, 204, 205, 206, 207, 208 connected between various combinations of power lines. A shunt assembly may also be referred to merely as a "shunt". Shunt assembly 202 is connected between L1 (210) and neutral (212); shunt assembly 204 is connected between L2 (214) and neutral (212), shunt assembly 206 is connected between L1 (210) and L2 (214); and shunt assembly 208 is connected between neutral (212) and ground (216). Shunt assembly 205 is connected between L2 (214) and ground (216), and shunt assembly 207 is connected between L1 (210) and ground (216). The system 200 is preferably installed in or nearby the circuit breaker box typically used with a single-phase system as described above.

Each shunt assembly 202, 204, 205, 206, 207, 208 is properly called an "assembly" in that it comprises a plurality of shunt devices, such as metal-oxide varistors (MOVs), gas discharge tubes, and combinations thereof, as well as other mechanical, electrical and ionization discharge devices. Each shunt assembly 202, 204, 205, 206, 207, 208 most preferably includes a shunt device and/or combination of shunt devices having varying reaction times and voltages, configured and operable to react to one or more of the E1, E2, and E3 components of the EMP pulse.

For example, each of shunts 202, 204, 205, 206, 207, 208 preferably include: a combination of MOVs, gas discharge tubes, or other mechanical, electrical and ionization discharge devices or other shunt components configured to react to, and shunt, an overvoltage pulse having the characteristics of an E1 component pulse, a combination of MOVs, gas discharge tubes, or other mechanical, electrical and ionization discharge devices or other shunt components configured to react to, and shunt, an overvoltage pulse having the characteristics of an E2 component pulse, and a combination of MOVs, gas discharge tubes, or other mechanical, electrical and ionization discharge devices or other shunt components configured to react to, and shunt, an overvoltage pulse having the characteristics of an E3 component pulse. Preferably the MOVs, gas discharge tubes, other mechanical, electrical and ionization discharge devices and/or other shunt components are configured to detect and protect against line-to-line, common mode, line-to-neutral, and line to ground overvoltage events. In one exemplary embodiment the device is further configured to protect and shunt neutral to ground over-voltages.

Continuing the example, each shunt comprises combinations of MOVs, gas discharge tubes, other mechanical, electrical and ionization discharge devices and/or other shunt components operable to shunt each of the E1, E2, and E3 component pulses and to react to the timing of the pulses as set forth in FIGS. 3 through 5. Most preferably, the configuration of MOVs, gas discharge tubes, other mechanical, electrical and ionization discharge devices and/or other shunt components have ratings and characteristics allowing them to react and shunt over-voltages in compliance with military specification MIL-STD-188-125-1. Preferably, the MOVs, gas discharge tubes, other mechanical, electrical and ionization discharge devices or other shunt components are rated to shunt the E1, E2, and E3 components with minimal degradation such that the system 200 remains operable to protect the electrical system after multiple shunt incidents.

Figure 8:
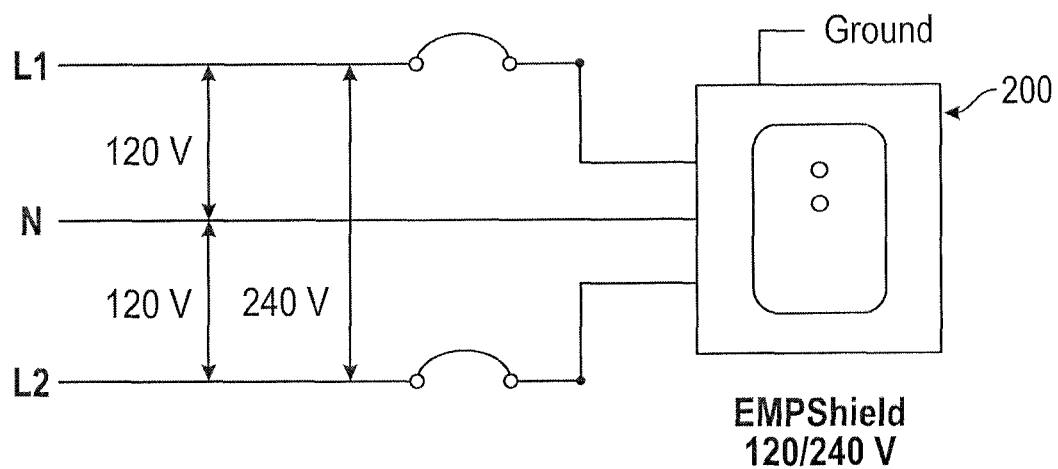
FIG. 8 is a schematic diagram of an embodiment of an exemplary encased system of the present invention in use with a typical single-phase electrical system.

In one exemplary embodiment, the components of system 200 (i.e., the MOVs, gas discharge tubes, other mechanical, electrical and ionization discharge devices and/or other shunt components) and any other associated circuitry and wiring are assembled onto a printed circuit board and enclosed within a case for mounting in proximity to a breaker box where power lines from a power grid enter a house or building as depicted in FIG. 8. In further embodiments, the system 200 and associated circuitry and wiring is encased in a potting material, such as an epoxy resin.

The system described above and referred to as system 200 described above may be applied to support protection of the European Union common single-phase electrical supply of 240 volts at 50 Hz. The major differences between the single-phase power supply in the United States (US), and the European Union (EU) is that the US version has two incoming power supply lines (L1 and L2), each with an electrical potential of 120 volts when referenced to ground, while the EU has one incoming power supply line with an electrical potential of 240 volts when referenced to ground. In addition, while the US electrical supply operates at 60 Hertz (Hz), the EU system operates at 50 Hz. Reconfiguring the system described above to protect a home or business utilizing the EU single-phase electrical supply is easily achieved by one knowledgeable in the art. This embodiment will detect and protect against line to neutral, line to ground, and neutral to ground over-voltages/over-currents.

Figure 7:
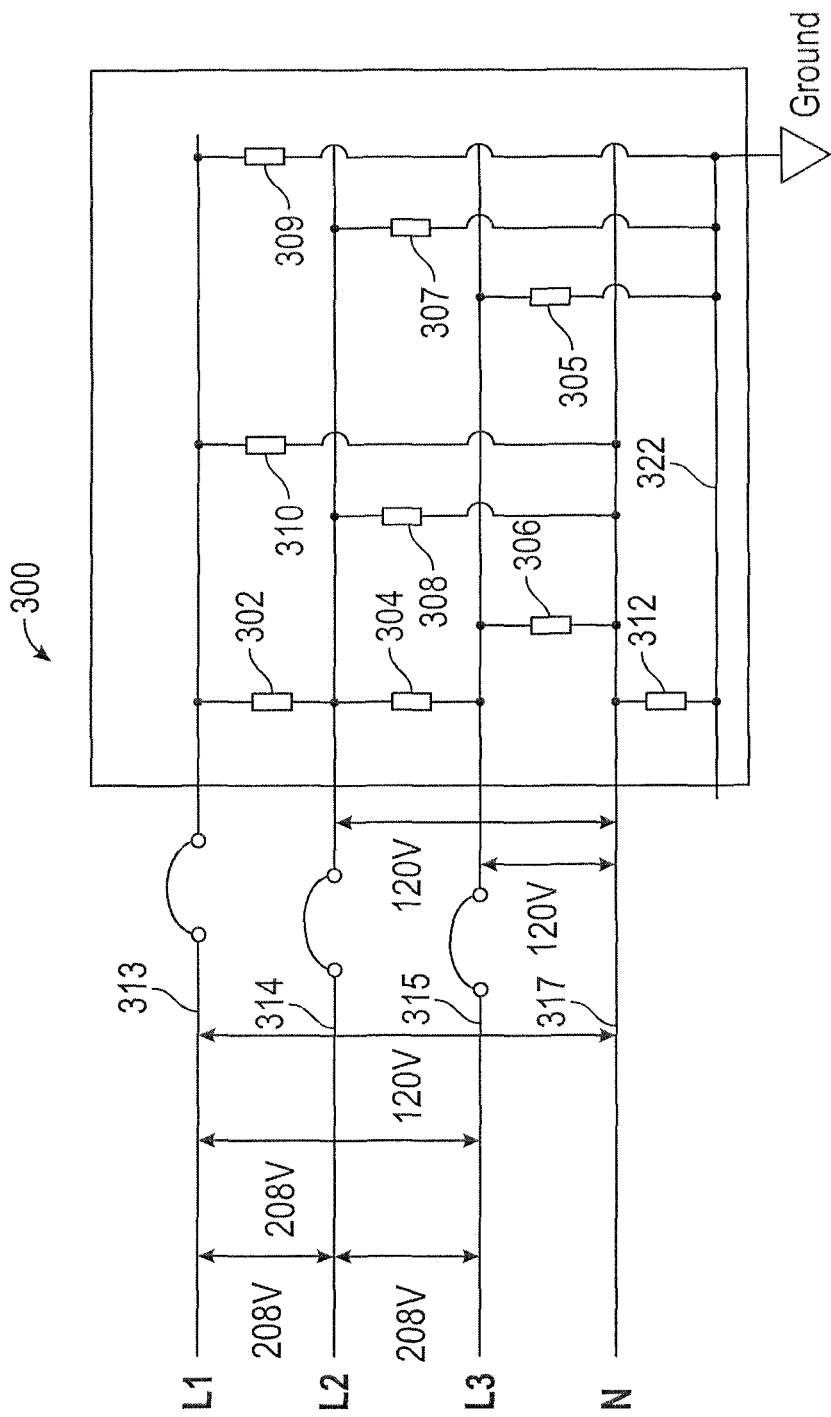
FIG. 7 is a schematic diagram of an exemplary embodiment of the system and method of the present invention for use with a typical three-phase electrical system.

Looking to FIG. 7, similar to the system 200 just described with respect to FIG. 6, a system 300 for suppressing an EMP generated by detonation of a nuclear weapon is depicted shown connected to a typical three-phase electrical system as described previously with respect to FIG. 2.

The system 300 comprises a plurality of shunt assemblies 302, 304, 305, 306, 307, 308, 309, 310, and 312 connected between various combinations of power lines (and ground and neutral) in a manner similar to that described above for a single-phase system. Specifically, shunt assembly 302 is connected between L1 (313) and L2 (314); Shunt assembly (304) is connected between L2 (314) and L3 (315); shunt assembly (306) is connected between L3 (315) and neutral (317); shunt assembly (308) is connected between L2 (314) and neutral (317); shunt assembly (310) is connected between L1 (313) and neutral (317); shunt assembly (305) is connected between L3 (315) and neutral (317); shunt assembly (307) is connected between L2 (314) and ground; shunt (309) is connected between L1 (313) and ground (322); and shunt assembly (312) is connected between neutral (317) and ground (322). The system 300 is preferably installed in or nearby the circuit breaker box typically used with a three-phase system as described above.

As also previously described each shunt assembly comprises a plurality of shunt devices, including metal-oxide varistors (MOVs), gas discharge tubes, other mechanical, electrical and ionization discharge devices and combinations thereof, with each shunt assembly including a shunt device and/or combination of shunt devices having varying reaction times and voltages, configured and operable to react to one or more of the E1, E2, and E3 components of the EMP pulse.

In a manner substantially similar to the system 300 described above, the thresholds and component configuration may be modified to support protection of a US 277/480 three phase power supply. The system would appear identical to the system 300 above, but would have overvoltage and over-current thresholds supporting the higher voltages of the 277/480 operating voltages as opposed to the 120/208 operating voltages described in the system 300 above. This modified system 300 embodiment will detect and protect against line to line, line to neutral, line to ground, and neutral to ground over-voltages/over-currents.

In a manner substantially similar to the system 300 described above, the thresholds and component configuration may be modified to support protection of a European Union common three-phase electrical supply of 400 volts at 50 Hz. The system would appear identical to the system 300 above, but would have overvoltage and overcurrent thresholds supporting the higher voltages of the 240/400 operating voltages as opposed to the 120/208 operating voltages described in the system 300 above. This modified system 300 embodiment will detect and protect against line to line, line to neutral, line to ground, and neutral to ground over-voltages/over-currents.

Likewise, each shunt comprises combinations of MOVs, gas discharge tubes, other mechanical, electrical and ionization discharge devices and/or other shunt components operable to shunt each of the E1, E2, and E3 component pulses and to react to the timing of the pulses as set forth in FIGS. 3 through 5. Most preferably, the configuration of MOVs, gas discharge tubes, other mechanical, electrical and ionization discharge devices and/or other shunt components have ratings and characteristics allowing them to react and shunt over-voltages in compliance with military specification MIL-STD-188-125-1.

Figure 9:
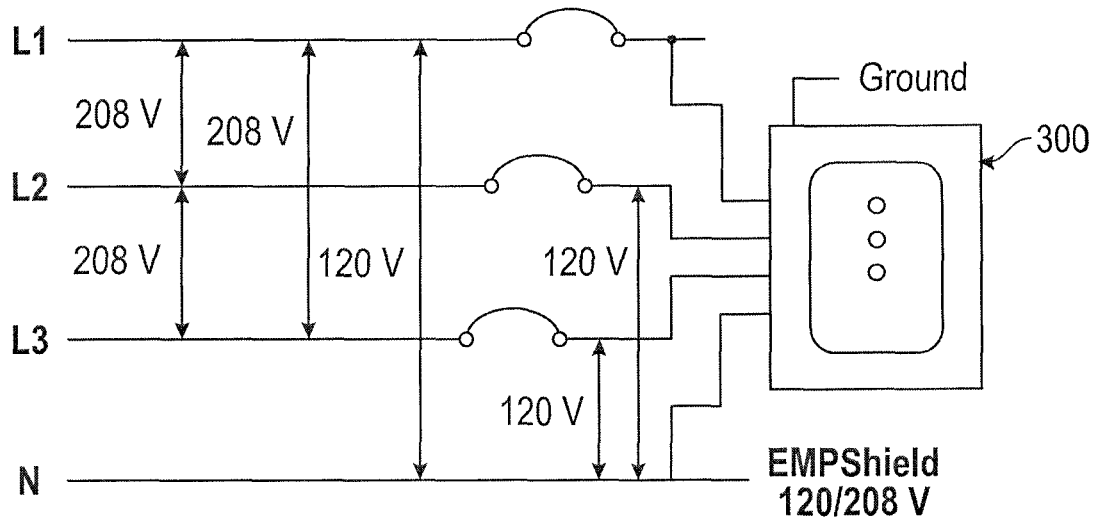
FIG. 9 is a schematic diagram of an embodiment of an exemplary encased system of the present invention in use with a typical three-phase electrical system.

In one exemplary embodiment, the components of system 300 (i.e., the MOVs, gas discharge tubes, other mechanical, electrical and ionization discharge devices and/or other shunt components) and any other associated circuitry and wiring are assembled onto a printed circuit board and enclosed within a case for mounting in proximity to a breaker box where power lines from a power grid enter a house or building as depicted in FIG. 9 In further embodiments, the system 300 and associated circuitry and wiring is encased in a potting material, such as an epoxy resin.

In use, the exemplary systems 200 and 300 as just described are operable to suppress an EMP pulse (comprising E1, E2, and E3 component pulses) as follows. Within less than one nanosecond of detection of an overvoltage exceeding a first E1 predetermined threshold on any one of a plurality of power lines, shunting the overvoltage to a neutral or ground to diminish the magnitude of the voltage level to below a second E1 predetermined threshold using one or more MOVs, one or more gas discharge tubes, or other mechanical, electrical and ionization discharge devices or combinations thereof. Simultaneously with detection and shunting of a fast duration E1 component pulse, detecting an intermediate duration E2 component pulse as being above a first E2 predetermined threshold level and, in less than a micro-second, shunting the second over-voltage using a combination of MOVs, gas discharge tubes, other mechanical, electrical and ionization discharge devices and/or other shunt components to less than a second E2 predetermined threshold level. Simultaneously, the system detects a long duration E3 component pulse as being above a first E3 predetermined threshold level and, within about one second, shunting the third over-voltage using a combination of MOVs, gas discharge tubes, other mechanical, electrical and ionization discharge devices and/or other shunt components to a second E3 predetermined threshold level.

In one exemplary embodiment, the MOVs, gas discharge tubes, other mechanical, electrical and ionization discharge devices and/or other shunt components used to detect and shunt the E1, E2, and E3 components, respectively, are separate, in other exemplary embodiments the MOVs, gas discharge tubes, and/or other shunt components used to detect and shunt the E1, E2, and E3 components have at least some commonality wherein one or more of the MOVs, gas discharge tubes, other mechanical, electrical and ionization discharge devices and/or other shunt components are used in the detection and shunting of one or more of the E1, E2, and E3 component events.

In another aspect, if the electric potential in the atmosphere is high enough to cause the grid wiring to have an over-voltage high enough to cause arcing, the system and method described above may include high-voltage arc-gap technology operable to shunt the over-voltage condition and to be grounded in a non-destructive manner. In this case, the arg-gap technology would be installed at an engineered interval to ensure that the over-voltage condition is shunted to ground in a non-destructive manner.

In use, the system and method for suppressing electromagnetic pulse-induced electrical system surges can be used to protect the electrical grid and grid components (i.e. transformers, substations, wiring, insulators, and associated hardware). Initially, the shunting devices described herein may be positioned and installed on the power originating side of each fuse, each shunting device including metallic-oxide varistors ("MOVs"), gas discharge tubes, other mechanical, electrical, and ionization discharge devices). Upon sensing a surge in voltage or over-current above a predetermined level, the system is operable to shunt the over-voltage or over-current condition through the fuse (i.e. to trip the breaker, blow the fuse, or otherwise ground the current). Accordingly, the transformer or substation is isolated from the grid, which also isolates it from the "antenna" (i.e. grid wiring), disabling the ability for the potential electrical current to pass through the transformer or substation, the build-up of heat within the transformer or substation is eliminated thereby eliminating or reducing any damage to the transformer or substations itself.

Figure 10:
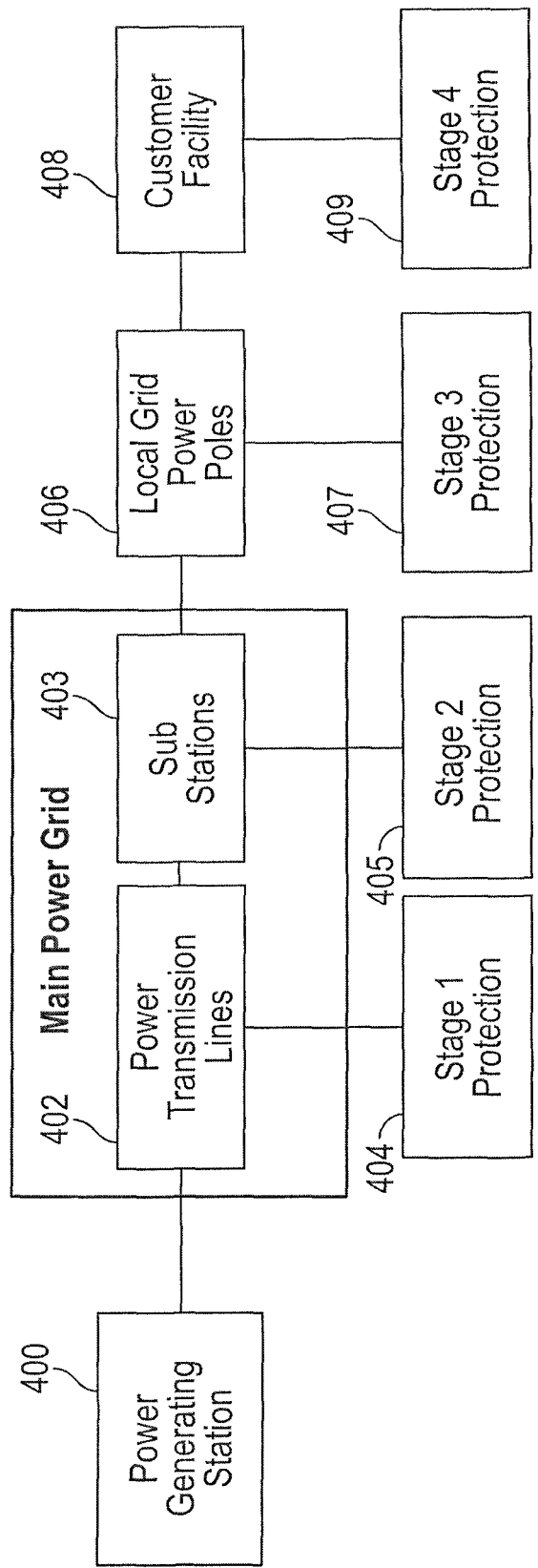
FIG. 10 is a block diagram illustrating operation of the system according to the present invention.

The multiple locations at which the shunting assemblies may be installed to protect electric systems as described herein are best understood with reference to the block diagram shown in FIG. 10. Electricity may be generated at a power generating station 400 such as at an electric, nuclear, hydroelectric plant, or the like. Next, generated electricity may be transferred via long distance or cross-country power transmission lines 402 such as the long and heavy lines seen stretching over mountain peaks, from Canada to the United States, and the like. Electricity is transferred at very high voltages and with high efficiency. The shunting devices described herein may be installed upstream of respective power transmission lines 402 so as to isolate them from electromagnetic pulses and this is referred to as Stage 1 Protection 404. Next, the voltage of transferred electricity may be reduced at respective substations 403 where the transferred electricity may be split up and diverted to regional areas and installing the shunting devices of the present invention upstream of these substations 403 is referred to as Stage 2 Protection 405.

Next, electricity may be directed through a local power grid, such as via electricity lines seen between the power poles 406 of a municipality, i.e. a town. Installing the present invention at this level is referred to as Stage 3 Protection 407. Finally, voltage is again reduced and delivered via a transformer to a customer facility 408 such as a residence or commercial facility. The shunting devices described above may be installed upstream of a respective meter or power box adjacent or inside the residence or building and this protection is known as Stage 4 Protection 409.

Accordingly, it can be seen that installing the system and devices described above to respective fuses at each transformer or substation from the initial power station downstream to every end user, all of the transformers and substations used to make up the overall electrical grid can be isolated from the wiring that makes up the grid. In other words, utilizing the system described above at every home, business, or facility that uses electricity will result in those locations being protected from damaging and disabling surges (i.e. the E1, E2, and E3 spikes) and any subsequent surges generated from feed wiring to the end-user facility and from within the end-user facility wiring.

Therefore, it can be seen that the system and method of the present invention are well-suited to suppress electrical surges and over-voltages induced by the detonation of a nuclear weapon, and the associated E1, E2, and E3 complex multi-pulse generated by that detonation. It will be appreciated that the system and method described above and recited in the claims below is functional in a substantially similar manner to shunt the electromagnetic pulses induced by a solar storm. For instance, a coronal mass ejection is a sun eruption of super-hot plasma that spews charged particles across the solar system and may induce currents in the electrical grid, overheating of transformers and causing mass failure within the electrical grid.

In addition, the system and method for suppressing electromagnetic pulse-induced electrical system surges can be used to protect radio systems from over-voltage/over-current induced in the antenna and wiring of the radio system in a manner substantially similar to that described previously. More particularly, this application is installed in-line with the radio sending signal and will shunt over-voltage/over-current above a predetermined threshold above the radio system normal power supply setting. This system is applicable to all radio frequency communications, antenna's and coax, for High Frequency (HF), Very High Frequency (VHF), and Ultra High Frequency (UHF) Radio systems.

Similarly, the system and method for suppressing electromagnetic pulse-induced electrical system surges described above can be used to protect Data Systems, Ethernet, RS-485, RS-422, RS-232, and Low Voltage Control Systems. To be clear, references to an "electrical system" in the subsequent claims may refer to electrical systems as configured in the United States, Europe, the military, and as may relate to radio signals, computing, data transfer, and the like. Still further, the present system and method may be used to protect DC electrical systems, i.e. systems including batteries. In all instances, the shunting assemblies are installed upstream of the electrical system to be protected from the electromagnetic pulses described above.

Many different arrangements and configurations of the system described and depicted, as well as components and features not shown, are possible without departing from the scope of the claims below. Likewise, variations in the order of the steps of the method described, as well as different combinations of steps, are within the scope of the present invention. Embodiments of the technology have been described with the intent to be illustrative rather than restrictive. Alternative embodiments will become apparent to readers of this disclosure after and because of reading it. Alternative means of implementing the aforementioned can be completed without departing from the scope of the claims below. Identification of structures as being configured to perform a particular function in this disclosure and in the claims below is intended to be inclusive of structures and arrangements or designs thereof that are within the scope of this disclosure and readily identifiable by one of skill in the art and that can perform the particular function in a similar way. Certain features and sub-combinations are of utility and may be employed without reference to other features and sub-combinations and are contemplated within the scope of the claims.

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described.

What is claimed is:

1. A method for suppressing an electrical surge induced by an electromagnetic pulse ("EMP") generated by a nuclear weapon detonation, comprising:
    detecting a first overvoltage exceeding a first E1 predetermined threshold level induced in an electrical system by an E1 component pulse;
    within less than one nanosecond after detection, shunting said first overvoltage to decrease the level of said first overvoltage to a second E1 predetermined threshold level using a first shunting assembly including MOVs, gas discharge tubes, other mechanical, electrical and ionization discharge devices and combinations thereof;
    detecting a second overvoltage exceeding a first E2 predetermined threshold level induced in an electrical system by an E2 component pulse;
    shunting said second overvoltage to decrease the level of said second overvoltage to a second E2 predetermined threshold level using a second shunting assembly including MOVs, gas discharge tubes, other mechanical, electrical and ionization discharge devices and combinations thereof;
    detecting a third overvoltage exceeding a first E3 predetermined threshold level induced in an electrical system by an E3 component pulse;
    shunting said third overvoltage to decrease the level of said third overvoltage to a second E3 predetermined threshold level using a third shunting assembly including MOVs, gas discharge tubes, other mechanical, electrical and ionization discharge devices and combinations thereof.

2. The method for suppressing an electrical surge as in claim 1, further comprising shunting first, second, and third over-voltages, respectively, with minimal degradation to first, second, and third shunting assemblies, respectively.

3. The method for suppressing an electrical surge as in claim 1, further comprising mounting respective shunting assemblies in a casing operable for mounting in proximity to a breaker box.

4. The method for suppressing an electrical surge as in claim 1, wherein each of said first, second, and third shunting assemblies includes a plurality of shunting devices taken from a group including MOVs, gas discharge tubes, other mechanical, electrical and ionization discharge devices and combinations thereof.

5. The method for suppressing an electrical surge as in claim 4, wherein said first, second, and third shunting assemblies have varied reaction times and voltages, respectively, and are operable to react to one of said E1, E2, and E3 component pulses, respectively.

6. The method for suppressing an electrical surge as in claim 1, further comprising connecting an external power distribution grid to a residential power box, wherein said electrical system is a single-phase electrical system having first and second power lines each carrying 120 volts relative to a neutral line, said first and second power lines being electrically connected upstream to a power grid and downstream to a residence.

7. The method for suppressing an electrical surge as in claim 6, wherein:
said external power distribution grid includes a transformer;
said residential power box includes a breaker operable for stopping an over-current of electricity.

8. The method for suppressing an electrical surge as in claim 7, wherein said electrical system includes a ground wire in electrical communication with said breaker and operable as a ground path for said over-current.

9. The method for suppressing an electrical surge as in claim 1, further comprising connecting an external power distribution grid to a commercial power box, wherein said electrical system is a three-phase electrical system having first, second, and third power lines each carrying 120 volts relative to a neutral line, said first and second power lines being electrically connected upstream to a power grid and downstream to a residence.

10. The method for suppressing an electrical surge as in claim 9, wherein:
said external power distribution grid includes a transformer;
said commercial power box includes a breaker operable for stopping an over-current of electricity.

11. The method for suppressing an electrical surge as in claim 10, wherein said electrical system includes a ground wire in electrical communication with said breaker and operable as a ground path for said over-current.

12. A surge suppression system for suppressing an electrical surge induced by a natural electromagnetic pulse ("EMP"), comprising:
a first shunting assembly including MOVs, gas discharge tubes, other mechanical, electrical and ionization discharge devices and combinations thereof that is operable to detect a first overvoltage exceeding a first E1 predetermined threshold level induced in an electrical system by an E1 component pulse;
wherein said first shunting assembly is operable to shunt said first overvoltage to decrease the level of said first overvoltage to a second E1 predetermined threshold level within less than one nanosecond after detection of said first overvoltage;
a second shunting assembly including MOVs, gas discharge tubes, other mechanical, electrical and ionization discharge devices and combinations thereof that is operable to detect a second overvoltage exceeding a first E2 predetermined threshold level induced in an electrical system by an E2 component pulse;
wherein said second shunting device is operable to shunt said second overvoltage to decrease the level of said second overvoltage to a second E2 predetermined threshold level;
a third shunting assembly including MOVs, gas discharge tubes, other mechanical, electrical and ionization discharge devices and combinations thereof that is operable to detect a third overvoltage exceeding a first E3 predetermined threshold level induced in an electrical system by an E3 component pulse;
wherein said third shunting device is operable to shunt said third overvoltage to decrease the level of said third overvoltage to a second E3 predetermined threshold level.

13. The surge suppression system as in claim 12, wherein:
said second shunting assembly is operable to shunt said second over-voltage within less than one microsecond after detection of said third overvoltage;
said third shunting assembly is operable to shunt said third over-voltage within less than one second after detection of said third overvoltage.

14. The surge suppression system as in claim 12, wherein said first shunting assembly, said second shunting assembly, and said third shunt assembly are operable to react to a timing of the E1, E2, and E3 component pulses, respectively, and are operable simultaneously.

15. The surge suppression system as in claim 12, wherein said first shunting assembly, said second shunting assembly, and said third shunt assembly are operable to shunt said first, second, and third over-voltages, respectively, with minimal degradation to any other shunt assembly.

16. The surge suppression system as in claim 12, wherein said first shunting assembly, said second shunting assembly, and said third shunt assembly are mounted in a casing operable for mounting in proximity to a breaker box.

17. The surge suppression system as in claim 12, wherein each of said first, second, and third shunting assemblies includes a plurality of shunting devices taken from a group including MOVs, gas discharge tubes, other mechanical, electrical and ionization discharge devices and combinations thereof.

18. The surge suppression system as in claim 17, wherein said plurality of shunting devices have varied reaction times and voltages, respectively, and are operable to react to one of said E1, E2, and E3 component pulses, respectively.

19. The surge suppression system as in claim 12, wherein said electrical system is a European Union single-phase electrical system having a single power line carrying 240 volts relative to a neutral line, said single power line being electrically connected upstream to a power grid and downstream to a residence.

20. The surge suppression system as in claim 12, wherein said electrical system is a 277/480 three-phase electrical system having first, second, and third power lines each carrying 277 volts relative to a neutral line, said power lines being electrically connected upstream to a power grid and downstream to breaker box inside a building.

21. The surge suppression system as in claim 12, wherein said electrical system is a radio system, said first, second, and third shunting assemblies mounted upstream of an antenna and coaxial cabling associated with said radio system.

22. The surge suppression system as in claim 12, wherein said electrical system is a European Union 240/400 three-phase electrical system having first, second, and third power lines each carrying 240 volts relative to a neutral line, said power lines beings electrically connected upstream to a power grid and downstream to breaker box inside a building.

* * * * *